United States Patent [19]

Safabakhsh

[11] Patent Number: 5,469,011
[45] Date of Patent: Nov. 21, 1995

[54] UNIBODY ULTRASONIC TRANSDUCER

[75] Inventor: Ali R. Safabakhsh, Wyane, Pa.

[73] Assignee: Kulicke & Soffa Investments, Inc., Wilmington, Del.

[21] Appl. No.: 161,847

[22] Filed: Dec. 6, 1993

[51] Int. Cl.⁶ .................................................. H01L 41/08
[52] U.S. Cl. ........................... 310/325; 310/323; 310/328
[58] Field of Search .................................... 310/323, 325, 310/328

[56] References Cited

U.S. PATENT DOCUMENTS

| | | | |
|---|---|---|---|
| 3,789,183 | 1/1974 | Conley | 310/323 X |
| 3,845,332 | 10/1974 | Last | 310/325 |
| 3,861,852 | 1/1975 | Berger | 310/325 X |
| 4,220,886 | 9/1980 | Ciszewski et al. | 310/325 |
| 4,850,534 | 7/1989 | Takahashi et al. | 310/325 X |
| 4,962,330 | 10/1990 | Lierke | 310/323 |
| 5,275,324 | 1/1994 | Yamazaki et al. | 228/1.1 |

FOREIGN PATENT DOCUMENTS 0231940  8/1987  European Pat. Off. ................ 310/325

OTHER PUBLICATIONS

Ultrasonic Innovations Boost Manufacturing Efficiency–p. 49 Product Engineering–Mar. 1973 issue (see tiny bonder).

Primary Examiner—Mark O. Budd
Attorney, Agent, or Firm—John B. Sowell

[57] ABSTRACT

A novel ultrasonic transducer comprises a machined solid metal unibody having a rectangular aperture in the center between a tool mounting end and a balanced end. The end portions are connected by two axial side members which connect to two transverse sides of the rectangular aperture. A stack of piezo electric crystals are mounted in said rectangular aperture between the transverse sides and spaced apart from the axial sides of the aperture. A bonding tool is mounted in a cylindrical aperture in the mounting end of the transducer and tightly mechanically coupled to the mounting end so that the stack of piezo electric crystals are acoustically coupled through the unibody to the bonding tool in a cylindrical aperture by a tightly coupled mounting surfaces.

16 Claims, 5 Drawing Sheets

UNIBODY ULTRASONIC TRANSDUCER

BACKGROUND OF THE INVENTION

1. Field of the Invention

The present invention relates to ultrasonic transducers of the type employed to bond two metallic elements together. More specifically, the present invention relates to a more efficient transducer of the type used on automatic wire bonders and ultrasonic machines employed in the semiconductor and other industries.

2. Description of the Prior Art

Heretofore, it was known that dissimilar metals could be joined at relatively low temperatures by the simultaneous application of pressure and ultrasonic energy applied through means of bonding tools mounted on or in ultrasonic transducers. At least since the introduction of integrated circuits in the 1960s, semiconductors have been bonded to a substrate or carrier using ultrasonic energy and fine wires have been interconnected from lead out pads on the semiconductor die to leads on carriers, substrates and lead frames using bonding tools mounted in ultrasonic transducers.

Heretofore, ultrasonic transducers that were designed for use on flip chip die and wire bonders have remained substantially unchanged for years. Such prior art ultrasonic transducers comprise a large number of individual parts that are difficult to assembly. Once the prior art transducers were assembled, they had to be tested, sorted, tuned and reworked. It was common practice to trim metal from the transducer driver in an attempt to adjust the transducer to a desired frequency and/or to save the transducer as an operative device. Such transducers are known as having high "Q" systems.

It would be highly desirable to provide a radically new ultrasonic transducer that eliminates most of the problems associated with prior art ultrasonic transducers.

SUMMARY OF THE INVENTION

It is a primary object of the present invention to provide a novel unibody ultrasonic transducer that is better, cheaper and more reliable than prior art transducers.

It is a primary object of the present invention to provide a novel unibody ultrasonic transducer that has fewer parts, and transfers ultrasonic energy more efficiently and is more stable over a wide range of frequencies than prior art transducers.

It is a primary object of the present invention to provide a novel ultrasonic driver for a novel unibody transducer that is easy to assemble and produces predictable and uniform results.

It is a primary object of the present invention to provide a novel ultrasonic driver for a novel unibody transducer that seldom, if ever, requires frequency adjustment and when required is easily and simply performed.

It is a primary object of the present invention to provide a novel unibody transducer that comprises an integral mounting flange located at the zero node of the ultrasonic driver mounted in the unibody that is substantially insensitive to the supporting structure on which it is mounted.

It is another primary object of the present invention to provide a novel unibody transducer that comprises an integral mounting flange on a unibody that is not subject to radial expansion and contraction.

It is a general object of the present invention to provide a novel capillary to mounting and clamping structure in an ultrasonic transducer.

It is a general object of the present invention to provide a novel unibody ultrasonic transducer that may be built to exact frequency requirements by scaling.

According to these and other objects of the present invention, there is provided a novel ultrasonic transducer comprising a machined solid metal unibody having a rectangular aperture in the center between two end portions connected by two axial side members which form transverse sides of the rectangular aperture. A stack of piezo electric crystals are mounted in said rectangular aperture between the axial sides of the aperture. The stack of piezo electric crystals are acoustically coupled to the bonding tool by a plurality of tapered shaped self-locking wedges which mount the piezo electric crystals in compression in the rectangular aperture. A bonding tool is mounted in a cylindrical aperture in one of the end portions.

BRIEF DESCRIPTION OF THE DRAWINGS

FIG. 2A is an enlarged view of the mating surfaces between crystals;

DESCRIPTION OF THE PREFERRED EMBODIMENT

Figure 1:
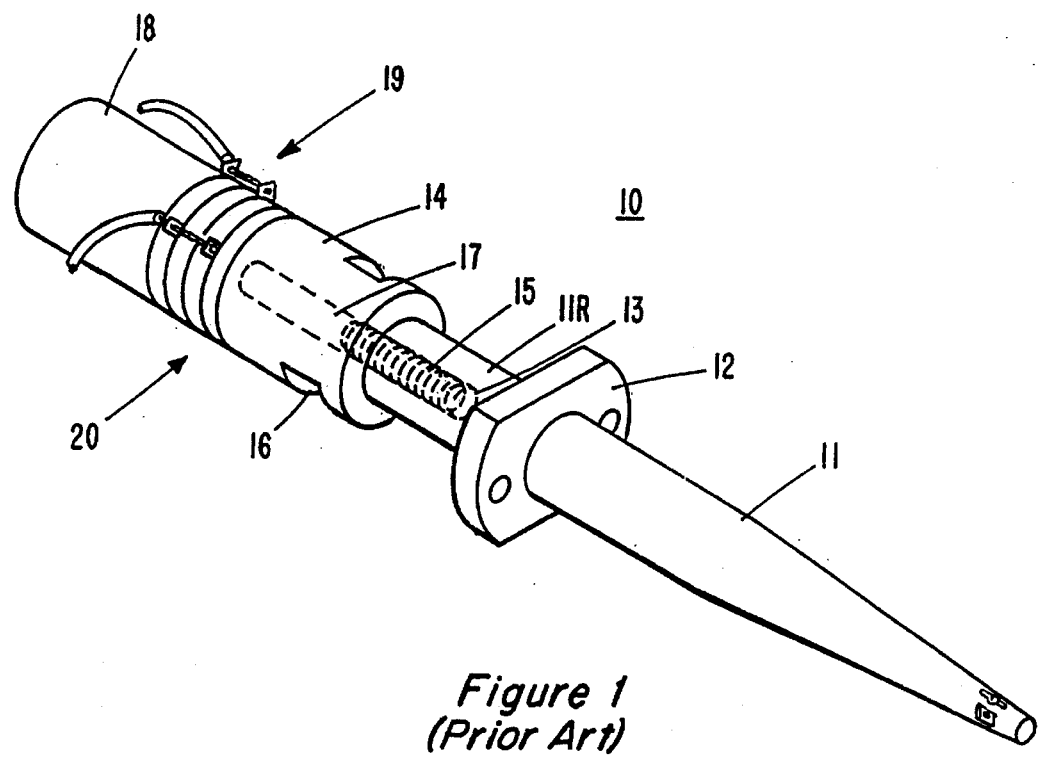
FIG. 1 is an isometric drawing of a typical prior art ultrasonic transducer used over a broad range of frequencies.

Refer now to FIG. 1 showing an isometric drawing of a typical prior art ultrasonic transducer 10. The transducer 10 comprises numerous parts which are bolted together. The transducer horn 11 has mounted thereon a mounting flange 12 which can be tightly mounted or an integral part of the horn 11. The rear portion of the transducer horn 11R is provided with a threaded hole 13 which is aligned with a hole through front bell 14 of the driver 20 shown having two flats 16 and a threaded through hole 17. A threaded screw 15 is mounted in the threaded holes 13 and 17 and connects the rear of the horn 11R to the front bell 14. A plurality of piezo electric crystals 19 are shown mounted between the front end bell 14 and a rear end bell 18.

Figure 2:
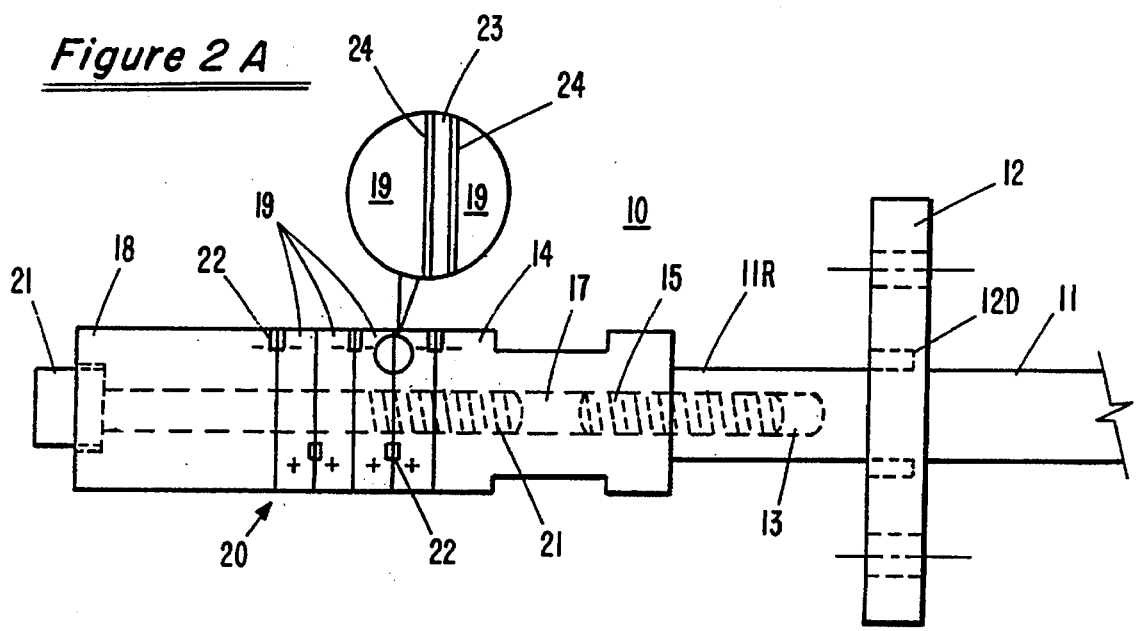
FIG. 2 is a plan view of the transducer driver shown in FIG. 1 showing details of the piezo electric crystals and mounting flanges.

Refer now to FIG. 2 and 2A showing a plan view of the transducer driver 20 of FIG. 1 attached to a horn 11R. The horn 11R is shown having a threaded aperture 13 which receives the threaded screw 15 and connects the front bell 14 of the driver 20 to the horn 11. The mounting flange 12 is shown having a thin diaphragm 12D which is mounted at the zero node of the horn 11.

The rear or end bell 18 is provided with a through hole for receiving a cap screw 21 therethrough. The threaded end of the cap screw 21 is connected into the threaded through hole 17 in the front bell 14. Tightening the cap screw 21 places the crystals 19 in compression sufficient that during operation they stay in the compression mode. Each of the crystals has a positive and a negative side which is indicated opposite the terminals 22. In the enlarged view shown in the circle, there is shown an electrically conductive shim 23 which is provided with a thin epoxy layer 24 on either side to give a tight surface to surface connection between the crystals 19. In the preferred way of assembling the shims, the epoxy layer 24 is wet and compressed to squeeze out any excess when the cap screw 21 is tightened to its predetermined force by a predetermined torque value,.

It will be noted that the prior art transducer 10 comprises at least five separate parts which are bolted together by screws 15 and 21 and that the mounting flange 12 may be a separate part which would simplify its manufacture.

Figure 3:
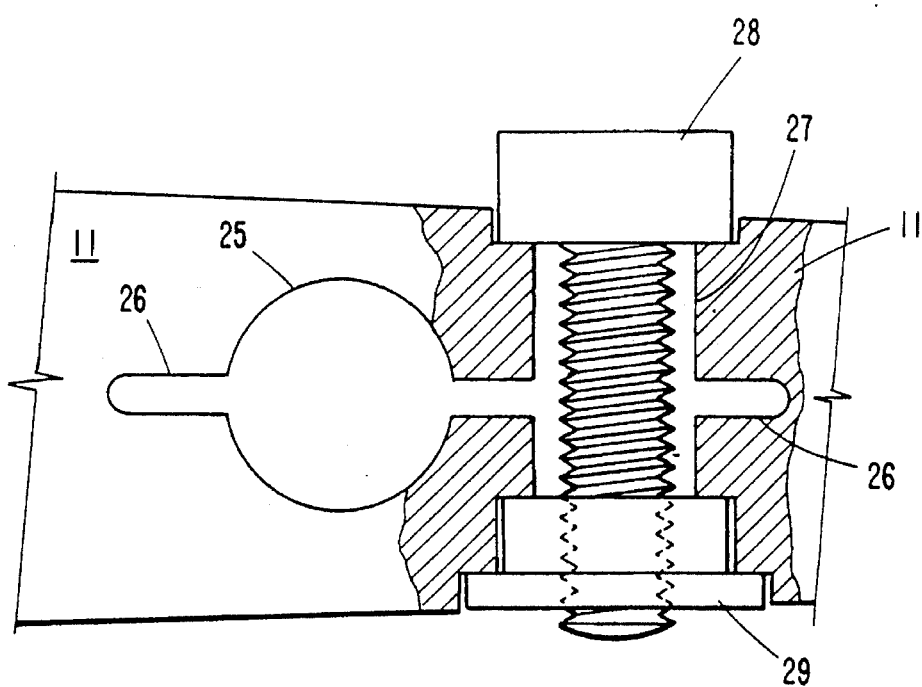
FIG. 3 is an enlarged plan view of the transducer horn of FIG. 1 showing the capillary recess and clamping mechanism.

Refer now to FIG. 3 showing an enlarged plan view in partial section of the prior art transducer horn 11 showing a capillary recess 25 having a relief recesses 26 at the front and rear. The front end of the transducer horn 11 is provided with a through hole 27 for receiving a cap screw 28 which threads into a square nut 29. Tightening the cap screw 28 reduces the size of the capillary recess 25, thus tightening the capillary by flexing the relief recesses 26. The problem with this prior art recess 25, 26 is that after prolonged usage and changing of tools it causes the hole to become elliptical and it loses its grip on the capillary (not shown). Further, the diameter of commercially available capillaries are not uniform, thus causing a loose fit of any undersized new capillary which accelerates the wear in the recess 25. If the capillary is too large, it cannot be fitted into the recess 25 or fits so tight as to become jammed in the hole.

Figure 4:
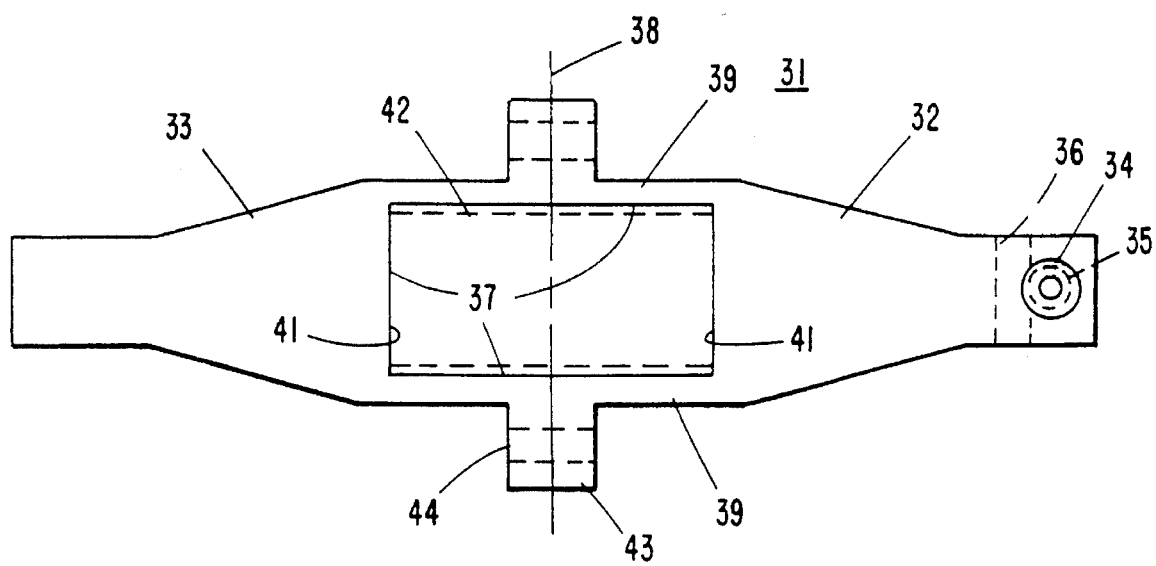
FIG. 4 is a plan view of the unibody portion of the present invention ultrasonic transducer.

Refer now to FIG. 4 showing a plan view of a typical preferred embodiment unibody portion of an ultrasonic transducer. The transducer unibody 31 is shown having a front end 32 and a rear end 33 which are substantially similar. The front end 32 is provided with a wire receiving cone 34 which connects to a tool receiving cylinder 35. A through hole or key hole 36 is shown in phantom lines transverse to the tool receiving hole 35. A rectangular aperture 37 is provided at the geometrical center line 38 of the transducer body 31. The rectangular aperture 37 has two axial sides 39 and two transverse sides 41 for engaging the piezo electric crystals (not shown). In the preferred embodiment of the present invention, when the piezo electric crystals are mounted in the aperture 37, they abut the transverse sides 41 to place the piezo electric crystals in compression, but are spaced apart from the axial sides 39 as shown by the clearance line 42. Thus, it will be understood that the piezo electric crystals expand in the axial direction against the abutting transverse walls 41 but do not touch the axial sides 39.

Figure 5:
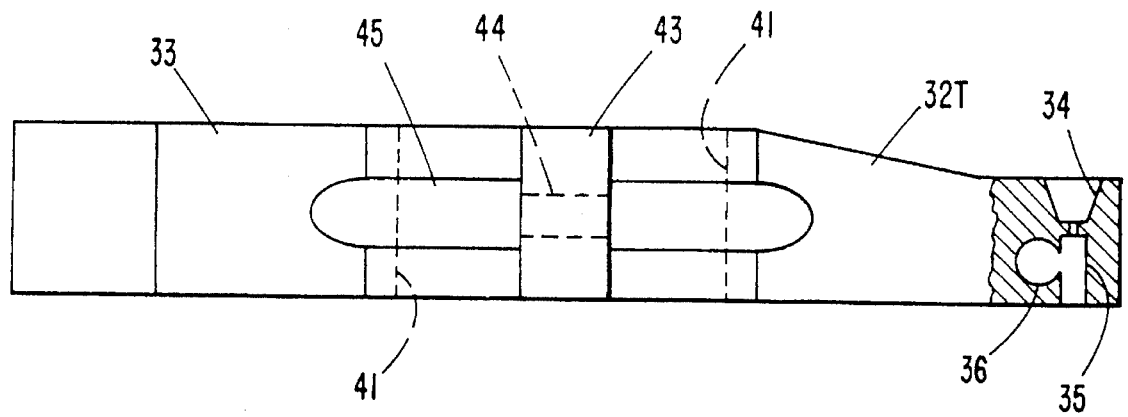
FIG. 5 is an elevation view of the present invention unibody ultrasonic transducer shown in FIG. 4.

Refer now to FIG. 5 showing an elevation view of the present invention unibody transducer shown in FIG. 4. The elements explained with reference to FIG. 4 are numbered the same in FIG. 5 and do not require additional explanation. The mounting flanges 43 are shown having mounting holes 44. The recess 45 is provided for clearance of cap screws or bolts used for mounting the flange 43 onto a supporting structure. It will be noted that the flange 43 is centered on center line 38 at the center of the rectangular aperture 37 so it will be at the zero node of the driver to be explained in greater detail hereinafter.

The through hole or key hole 36 is shown intercepting the tool receiving cylinder 35 which interconnects with the wire receiving cone 34. It will be noted that the front end 32 is provided with a taper 32T and that the symmetrical end 32 will have less mass than its symmetrical end 33. The amount of mass removed by the taper 32T is equal to the amount of mass added by the capillary bonding tool (not shown) and the locking mechanism to be explained hereinafter.

Figure 6:
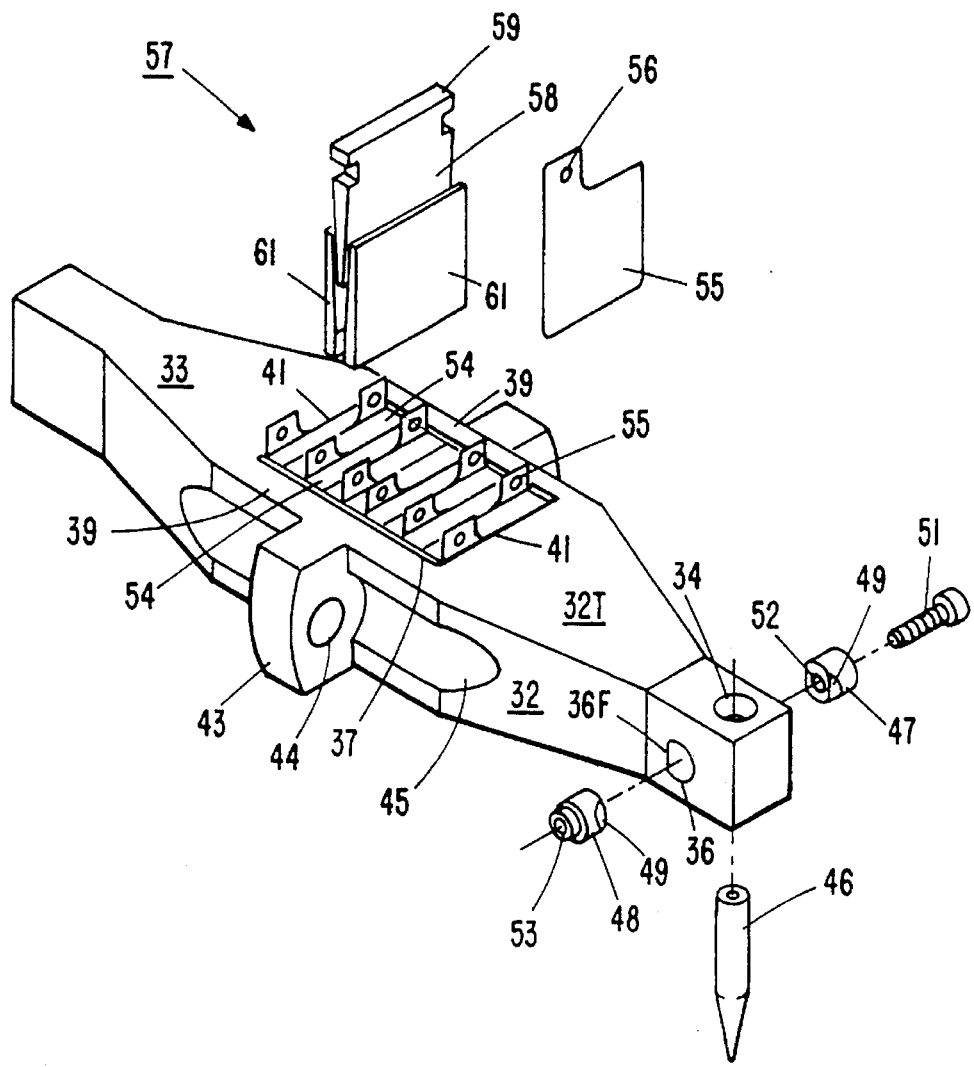
FIG. 6 is an isometric view of the present invention ultrasonic transducer showing the transducer drivers and capillary clamping mechanism.

Refer now to FIG. 6 showing an isometric view of the present invention ultrasonic transducer and also showing the transducer drivers and capillary clamping mechanism. The unibody and driver have been numbered the same as FIGS. 4 and 5 and do not require additional explanation. The key hole 36 is shown having a flat mounting surface 36F for receiving therein a pair of cylindrical clamping elements 47 and 48 also having a similar flat surface. The cylindrical clamping elements 47 and 48 are provided with inclined cam surfaces 49 which engage upon the capillary 46 when the cap screw 51 is threaded into the threaded hole 53 of the cylindrical element 48. The cylindrical element 47 is provided with a through hole 52 which is not threaded. When the cap screw 51 is turned and threaded into the threaded hole 53, the two cylindrical elements 47 and 48 are loose in the key hole 36 and are biased towards each other and against the side wall of the capillary 46 in line contact and are forced in surface contact with the flat 36F, thus providing an excellent mechanical coupling.

The rectangular aperture 37 having axial side walls 39 and transverse side walls 41, are shown having mounted therein a plurality of piezo electric crystals 54 separated by a plurality of shims 55 each having an electrical connecting tab 56.

Shown directly above the piezo electric crystals 54 is a preferred wedge mechanism 57 which comprises three elements. The center element is a double tapered wedge 58 having removing ears 59 fitted between a pair of single tapered wedges 61. The angle of the taper between the wedges 58 and 61 is designed to be self-locking. The surface of the wedges 58 and 61 is relatively smooth but enhances self-locking when forced together under pressure. A predetermined amount of pressure in the vertical direction will result in a known amount of compressive force in the axial direction as is well known in the wedge and cam art. Thus, the piezo electric crystals and shims may be placed in the rectangular aperture 37 separated from the sides 39 and then compressed to a predetermined compression force by inserting the wedge 59 into the wedges 61. Testing after the fact, confirms that the resonant frequency and amount of compression was correct.

In the preferred embodiment of the present invention, careful manufacture of the unibody 10 and assembly of the drivers usually results in obtaining the proper predetermined frequency. However, it is possible to remove material from the extreme ends 32 and 33 which will increase the frequency. Thus, the preferred method of manufacture is error on the low frequency side if the manufacturing process is not exact and precise. In the present invention, the shims 55 are made from an electrically conductive brass and do not require the aforementioned epoxy 24 to achieve excellent mechanical coupling.

Figure 7:
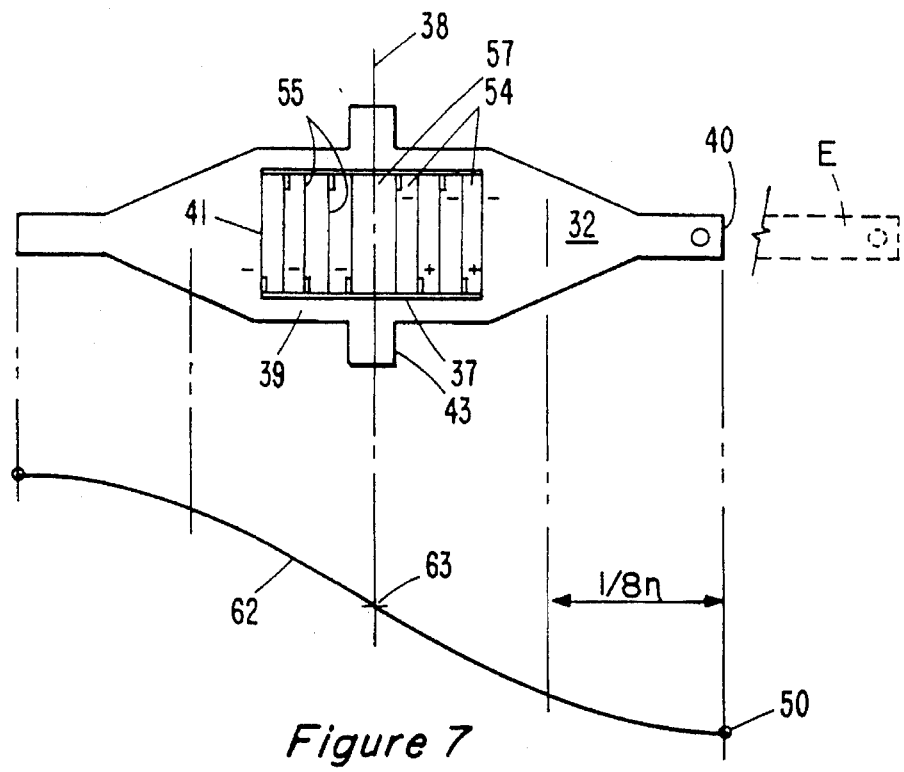
FIG. 7 is a top view of a 60 kilohertz unibody transducer having superimposed thereon a half wave displacement characteristic of the transducer body.

Refer now to FIG. 7 showing a top view of a 60 kilohertz unibody transducer 10 which operates in a half wave (½ λ) displacement mode as shown by wave form 62. The center of the wave form 62 at zero node 63 is on center line 38 of the drivers which comprise a plurality of piezo electric crystals 54 separated by electrically conductive shims 55. The stack of piezo electric crystals are shown engaged against the transverse walls 41 and spaced apart from the axial sides 39. The stack piezo electric crystals are placed in a preferred amount of compression by the wedge mechanism system 57 as explained hereinbefore. The 60 kilohertz unibody transducer shown in FIG. 7 is divided into four ⅛$^{th}$ wave length (⅛ λ) wave segments showing that the maximum displacement occurs at the end 40 of the unibody and not at the center 38 of the unibody.

The horn or end 40 which holds the capillary incurs the maximum displacement while the mounting flange 43 incurs the minimum displacement. Should the horn 40 be extended a full half wave (½ λ), a maximum displacement node 50 will again occur at the length of maximum displacement. Thus, the present unibody transducers may be lengthened by half wave (½ λ) extensions E (shown in phantom lines) and still maintain the operational efficiency of the 60 kilohertz unibody transducer shown in FIG. 7. Stated differently, the 60 kilohertz transducer shown in FIG. 7 may be extended by one or more ½ wave lengths while maintaining the resonant frequency at 60 kilohertz.

Figure 8:
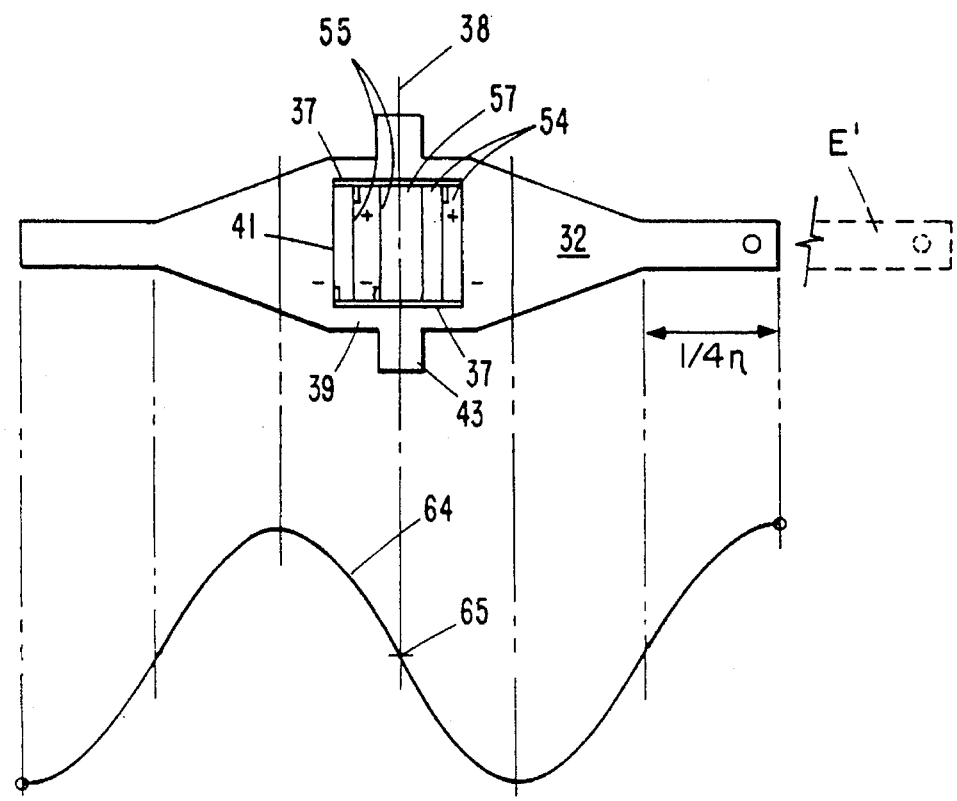
FIG. 8 is a top view of a 120 kilohertz unibody transducer having superimposed thereon a one and one half wave displacement characteristic of the transducer body.

Refer now to FIG. 8 showing a top view of a 120 kilohertz unibody transducer 10 which has elements numbered identically as the elements in FIG. 7. It will be noted that the rectangular aperture 37 for receiving the piezo electric crystals is shorter in the axial direction and approximately the same width. However, the length of the unibody 10 is longer than the length of the unibody shown in FIG. 7 and has a displacement wave form 64 that is one and one-half wave lengths overall (1½ λ). It will be noted that the front end 32 which holds the capillary has the maximum displacement and that the center of the transducer is provided with a zero node 65 which also occurs at the center of the driver.

While the overall length of the 120 kilohertz transducer is only slightly longer in physical length than the 60 kilohertz transducer, it is 1½ wavelengths (or three times as long) even though the frequency is doubled. Those skilled in the art of designing transducers understand that the higher frequency transducer shown in FIG. 8 may be constructed by scaling from the model of the lower frequency transducer shown in FIG. 7.

The horn or end 40' which holds the capillary incurs the maximum displacement and may also be extended by one-half wave lengths E' shown in phantom lines as explained hereinbefore.

Figure 9:
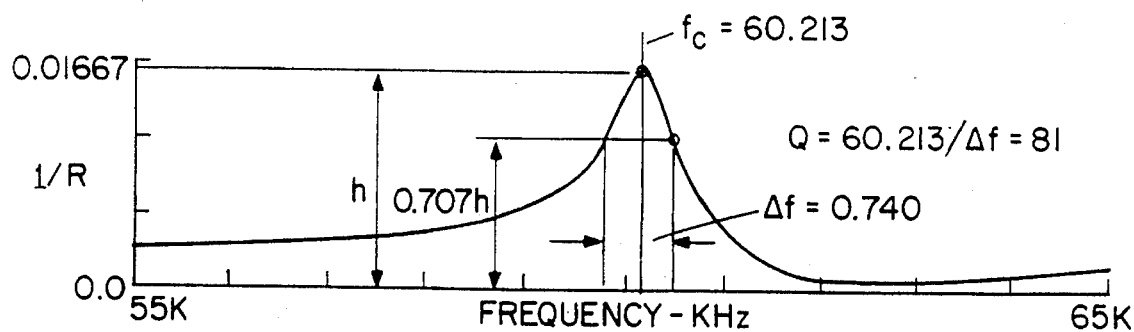
FIG. 9 is a wave form of frequency versus impedance illustrating the low Q characteristic and broad operable frequency of the preferred embodiment 60 kilohertz transducer shown in FIG. 7.

Refer now to FIG. 9 showing a wave form of frequency versus impedance (1/R) to illustrate the low Q and broad resonant frequency of the present invention 60 kilohertz transducer shown in FIG. 7. Q is a dimensionless factor that shows the mechanical efficiency of the resonant system. In this case, the center frequency $F_c$ is equal to 60.213 kilohertz. The frequency band width (ΔF) at 0.707 times the peak height H, is shown as 740 hertz, thus Q is equal to 60,213 divided by ΔF which is equal to 81. Stated differently the resonant frequency of the transducer can be varied over a range of 740 hertz without diminishing the displacement by approximately 30%. While not shown on FIG. 9, it is known that the Q of the prior art transducer shown in FIG. 1 is approximately 1200, and at a resonant frequency of 60 kilohertz, the same amount of displacement reduction will occur over a range of frequency of only 60 hertz. It will be appreciated that the broader ΔF frequency or lower Q of the present invention transducer provides a wider range of operations under loads which changes the resonant frequency of the transducer.

Figure 10:
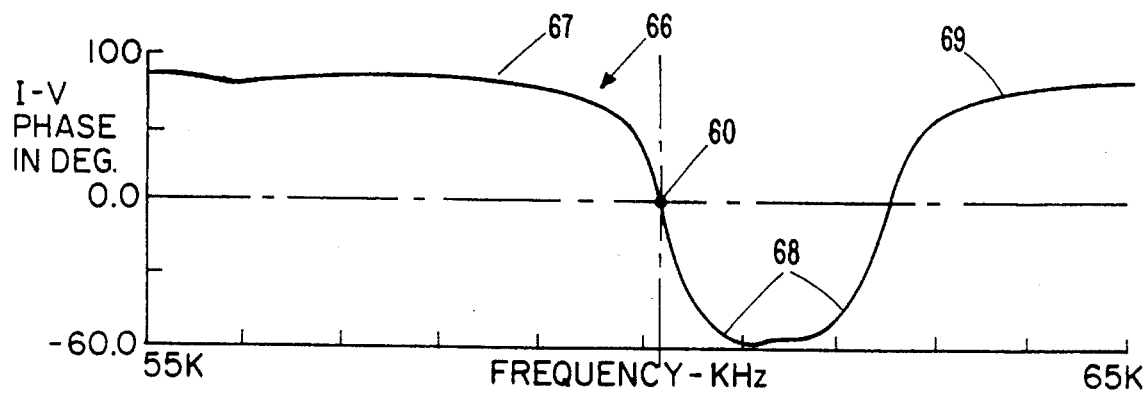
FIG. 10 is a wave form of frequency versus phase angle between current and voltage applied to the drivers of the novel transducers of FIG. 7.

Refer now to FIG. 10 showing a wave form of frequency versus phase in degrees between current and the voltage. The wave form 66 is shown having a portion 67 where the displacement of the tip of the transducer leads the voltage. Then wave form 66 passes through a node 60 where the voltage and current are in phase, then passes into a portion 68 where the displacement lags the voltage and again rises to a portion 69 where the displacement of the end of the transducer leads the voltage. The wave form 66 is another representation of the insensitivity of the transducer to frequency variations. If the Q was larger than 81 as shown in FIG. 9, the portion of the curve on either side of the node 60 would be sharply inclined.

Figure 11:
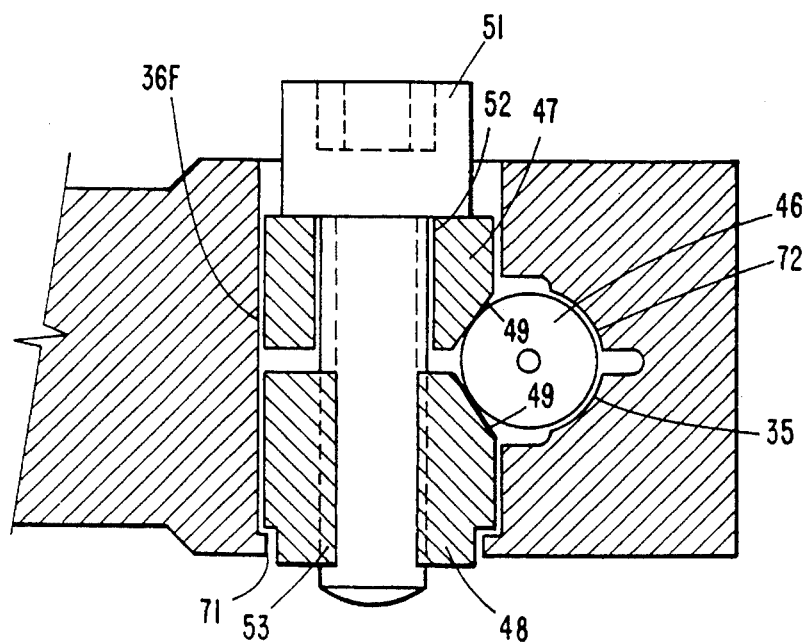
FIG. 11 is an enlarged plan view in section showing the details of a preferred capillary clamping mechanism.

Refer now to FIG. 11 showing an enlarged plan view in section of a preferred capillary clamping mechanism of the type shown in FIG. 6. The capillary 46 is shown engaged in line contact with the cam surfaces 49 on the cylindrical clamping elements 47 and 48. The line contact wears in to provide a concave mating surface and superior coupling. The cylindrical clamping element 47 is provided with a smooth through hole 52, whereas the cylindrical clamping element 48 is provided with a threaded through hole 53. The rear surface of the cylindrical clamping elements 47 and 48 is flat so as to provide a tight mechanical coupling with the flat surface 36F of the through hole 36. To prevent the clamping mechanism from sliding completely through the through hole 36, a protrusion or chamfer 71 provided at the lower end and prevents the cylindrical element 48 from passing therethrough when the capillary 46 is not in place. The cap screw 51 when tightened acts as a Dutch key to force the cylindrical surface of the capillary 46 into surface contact with the wall 72 of the receiving cylinder 35 and at the same time, causes a forcing action which engages the flat surface on the cylindrical elements 47, 48 against surface 36F. It is has been found that the clamping structure shown in FIG. 11 is insensitive to the size of the capillary 46 and in fact tends to wear so as to make a tight mating surface between the cylinder wall 35 and the cylinder wall 35 and the capillary 46. Further, another feature of the present invention is that end holder for the transducer 46 is more massive than a tapered horn transducer of the type shown in FIG. 1 and is less sensitive to breaking and fractures.

Having explained a preferred embodiment of the present invention, it will be understood that the novel unibody 31 can be constructed in frequency harmonics of each other. The resonant frequency can cover a wide range selected at ranges between 20 to 200 kilohertz and still operate as an efficient bonding tool.

It will be appreciated that the unibody of the present invention is much easier to manufacture, thus incurs less acoustic energy losses, less labor cost and lasts longer than prior art type transducers. Another feature of the present invention is that the unibody may be easily and cheaply constructed so uniformly so that the resonant frequency is very accurately predicted and repeatable. Further, the impedance of different transducers is within a very small range and requires less testing and tuning and adjusting than the prior art type transducers. Removal of an end portion of the balance end of approximately several millimeters will increase the frequency by 10 hertz in the preferred embodiment transducer shown.

It has been found that the unibody transducer incurs less acoustic energy loss, thus delivers higher energy.

What is claimed is:

1. An ultrasonic transducer, comprising:

a monolithic body, a substantially rectangular aperture through said one piece body formed by two axial sides and two transverse sides, said one piece body having a tool holder end extended axially from a first transverse side, said one piece body having a balance end extending axially from a second transverse side, transducer driver means comprising a plurality of piezoelectric crystals in a stack axially aligned in said rectangular aperture, and wedge means located in the center of said stack of piezoelectric crystals in said rectangular aperture in alignment of said transducer driver means for placing said transducer driver means in a compression mode between said two transverse sides.

2. An ultrasonic transducer as set forth in claim 1 wherein said monolithic body further comprises a pair of mounting flanges extending from said axial sides of said rectangular aperture.

3. An ultrasonic transducer as set forth in claim 2 wherein said mounting flanges extending from said axial sides are positioned at the zero node center of mass of said monolithic body.

4. An ultrasonic transducer as set forth in claim 1 wherein said transducer driver means are placed in compression between said transverse sides of said rectangular aperture and are spaced apart from said axial sides of said rectangular aperture.

5. An ultrasonic transducer as set forth in claim 1 wherein said wedge means comprises three separate wedges, one of which is removable and self locking.

6. An ultrasonic transducer as set forth in claim 1 wherein said tool holder end comprises:

a vertical cylindrical aperture for receiving a capillary bonding tool, a transverse cylindrical aperture which intercepts said vertical cylindrical aperture, and a Dutch key mechanism mounted in said transverse cylindrical aperture for engaging with a bonding capillary when inserted in said vertical cylindrical aperture.

7. An ultrasonic transducer as set forth in claim 6 wherein said transverse cylindrical aperture is provided with a small flat surface for engaging with a similar flat surface on said Dutch key mechanism to prevent rotation.

8. An ultrasonic transducer as set forth in claim 7 wherein said Dutch key mechanism comprises a pair of cylindrical clamping elements, each having similar flat surfaces, and said clamping elements being biased together by a cap screw threaded into one of the clamping elements, whereby transverse force on said clamping element exerts an axial force on a capillary placed in said vertical cylindrical aperture.

9. An ultrasonic transducer as set forth in claim 8 wherein said small flat surface on said pair of cylindrical clamping elements are tightly engaged, and mechanically coupled ultrasonically, with said transducer by the transverse force of said clamping elements.

10. An ultrasonic transducer as set forth in claim 8 wherein said cylindrical clamping elements each incur wear and produce a concave cam surface for engagement with a capillary when placed in said vertical cylindrical aperture.

11. An ultrasonic transducer as set forth in claim 1 wherein said monolithic piece body comprises a unibody machined from a single piece of metal and wherein said transducer driver means comprises a stack of individual piezo electric crystals placed in compression between said two transverse sides and are acoustically coupled to said transverse sides of said unibody in an axial direction and spaced apart from said unibody in a transverse direction.

12. An ultrasonic transducer as set forth in claim 11 which further includes a plurality of thin metal shims positioned between adjacent piezo electric crystals in said stack of piezo electric crystals for providing acoustic coupling and an electrical connection therebetween.

13. An ultrasonic transducer as set forth in claim 12 wherein said wedge means in the center of said stack of piezo electric crystals provides acoustic and electrical coupling between the individual piezo electric crystals on either side thereof.

14. An ultrasonic transducer as set forth in claim 13 wherein said tool holder end of said monolithic body is terminated in a rectangular head having aperture means for receiving a bonding capillary therein, and clamping means mounted in said aperture means for acoustically coupling said rectangular head to said bonding capillary.

15. An ultrasonic transducer as set forth in claim 13 wherein said monolithic body comprises a pair of integral mounting flanges extending transversely from the axial sides of the exact center of said rectangular aperture which forms the zero node or center line of said rectangular aperture.

16. An ultrasonic transducer as set forth in claim 1 where said balance end is terminated in a rectangular head of predetermined mass dimensions, and wherein removal of a predetermined amount of the end portion mass thereof increases the natural frequency of said ultrasonic transducer by approximately 10 hertz.

\* \* \* \* \*